United States Patent
Lee et al.

(10) Patent No.: US 6,515,924 B2
(45) Date of Patent: Feb. 4, 2003

(54) SEMICONDUCTOR MEMORY DEVICE

(75) Inventors: Sang Pil Lee, Kyoungki-do (KR); Jong Tai Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/037,891

(22) Filed: Oct. 23, 2001

(65) Prior Publication Data

US 2002/0057611 A1 May 16, 2002

(30) Foreign Application Priority Data

Oct. 24, 2000 (KR) .......................... 2000-62583

(51) Int. Cl.⁷ ................................. G11C 7/00
(52) U.S. Cl. ................... 365/203; 365/230.01
(58) Field of Search ............... 365/203, 230.01

(56) References Cited

U.S. PATENT DOCUMENTS 6,310,823 B1 * 10/2001 June .......................... 365/233

* cited by examiner

Primary Examiner—M. Tran
(74) Attorney, Agent, or Firm—Ladas & Parry

(57) ABSTRACT

Semiconductor memory device comprising a command buffer unit for inputting rasb, casb and web of TTL level and buffering to CMOS level, a unit for buffering bank address signal of TTL level to CMOS level, a cas enable bank signal generating unit indicating the enabled bank wherein the CAS is being performed, a precharge interrupt signal generating unit for combining output signals of the command buffer unit to detect precharge command and for comparing output signal of the bank address buffer unit and the inputted enable bank signal and if enabled bank corresponds to the selected bank, generating and latching precharge interrupt signals to master clock and outputting same, and a unit for generating strobe signals operating predecoder to select bank by external cas or internal cas, controlling options by the precharge interrupt signal, thereby reducing signal lines to bank and preventing unnecessary operations of predecoder and reducing power consumption.

2 Claims, 3 Drawing Sheets

SEMICONDUCTOR MEMORY DEVICE

BACKGROUND OF THE INVENTION

1. Field of the Invention

The present invention relates to a semiconductor memory device, and more particularly, to a semiconductor memory device reducing power consumption by reducing signal lines to bank and preventing unnecessary operations of predecoder that is possible by interrupting signals generated from global area in a termination of CAS operation according to precharge interrupt command, during CAS access.

2. Description of the Related Art

FIG. 1 is a block diagram of semiconductor memory device related to interrupt when a conventional precharge signal is generated.

As shown in FIG. 1, it comprises a command buffer unit 1 for inputting rasb, casb and web of TTL level and for buffering them to CMOS level; a bank address buffer unit 2 for buffering bank address signal badd<i> of TTL level to CMOS level; a cas enable bank signal generating unit 3 for generating cas enable bank signal casen_ba<i> indicating bank wherein CAS command is performing; and a precharge interrupt signal generating unit 4 for inputting and combining output signals rasx, casz, wex of the command buffer unit 1 and for selecting bank of precharge command inputted by receiving output signal bat<i> of the bank address buffer unit 2 and if the cas enable bank signal casen_ba<i> corresponds to the bank of inputted precharge command, finally for generating precharge interrupt signal pcgterm to the corresponding bank 5_n.

According to the conventional precharge interrupt, output signals of command buffer unit 1 rasx, casz, wex are combined in the precharge interrupt signal generating unit 4 and output signal bat<i> of the bank address buffer unit 2 is received to select bank of precharge command having the inputted bank address.

And, cas enable bank signal casen_ba<i> indicating bank wherein CAS command is performing is received and then, if the bank of inputted precharge command corresponds to the cas enable bank signal casen_ba<i>, precharge interrupt signal pcgterm is generated, thereby disabling column selection signal (in read) enabled in the corresponding bank or signal transmitted from global input/output line to data bus line of core (in write) in the corresponding clock.

However, according to the conventional semiconductor memory device, it is difficult for the precharge interrupt signal pcgterm to cover all the banks and therefore, signals are locally generated in each bank. As a result, the number of signal lines is increased from global area to local area and accordingly power consumption is also increased since the interrupted signals are almost in final step of cell access.

SUMMARY OF THE INVENTION

Therefore, the present invention has been made to solve the above problems and the object of the present invention is to provide a semiconductor memory device reducing power consumption by reducing signal lines to bank and preventing unnecessary operations of predecoder that is possible by minimizing delay time from buffer to master clock latch and interrupt inner command enable, thereby performing interrupt to predecoder strobe signal.

In order to accomplish the above object, the present invention comprises: a command buffer unit for inputting rasb, casb and web of TTL level and then buffering them to CMOS level; a bank address buffer unit for buffering bank address signal of TTL level to CMOS level; a cas enable bank signal generating unit for generating cas enable bank signal indicating enabled bank wherein the CAS is being performed; a precharge interrupt signal generating unit for combining output signals of the command buffer unit to detect precharge command and for comparing output signal of the bank address buffer unit and the inputted enable bank signal and if enabled bank corresponds to the bank selected by detected precharge command, for generating precharge interrupt signals and latching the generated precharge interrupt signals to master clock and finally outputting the signals; and a predecoder strobe signal generating unit for generating strobe signals operating predecoder to select bank by external cas or internal cas, the operations being controlled by the precharge interrupt signal.

And, the precharge interrupt signal generating unit comprises: a command decoding unit for decoding output signals of the command buffer unit; a bank decoding unit for comparing the output signal of bank address buffer unit and the cas enable bank signal and then for outputting signals indicating whether the enabled bank corresponds to the bank selected by detected precharge command; an enable signal generating unit for generating enable signal by using the output signals of the bank decoding unit according to output signals of the command decoding unit; and a latch unit for latching the enable signal to master clock and then for outputting precharge interrupt signal.

According to the above invention, precharge interrupt internal command is generated by using delay time for setup/hold time and then the signal is synchronized to internal clock, thereby terminating enable time of interrupt command at the beginning of CAS operation. Therefore, special time of CAS path is interrupted in global area, thereby reducing circuit area and preventing unnecessary circuit operations. As a result, it is effective in saving power consumption.

BRIEF DESCRIPTION OF THE DRAWINGS

The above objects, and other features and advantages of the present invention will become more apparent after reading the following detailed description when taken in conjunction with the drawings.

DETAILED DESCRIPTION OF THE DRAWINGS

Figure 1:
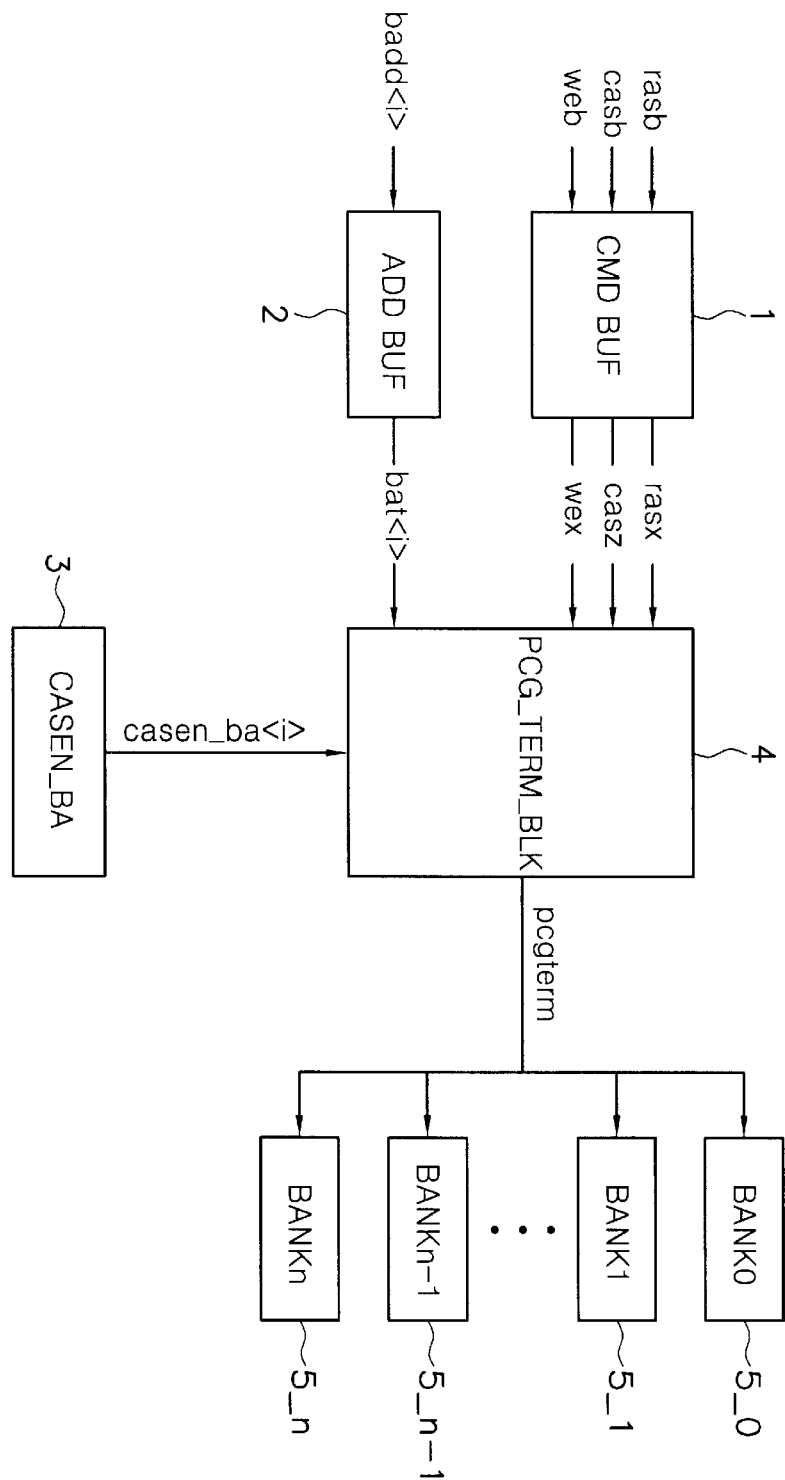
FIG. 1 is a block diagram of semiconductor memory device for performing interrupt according to conventional precharge command.
Figure 2:
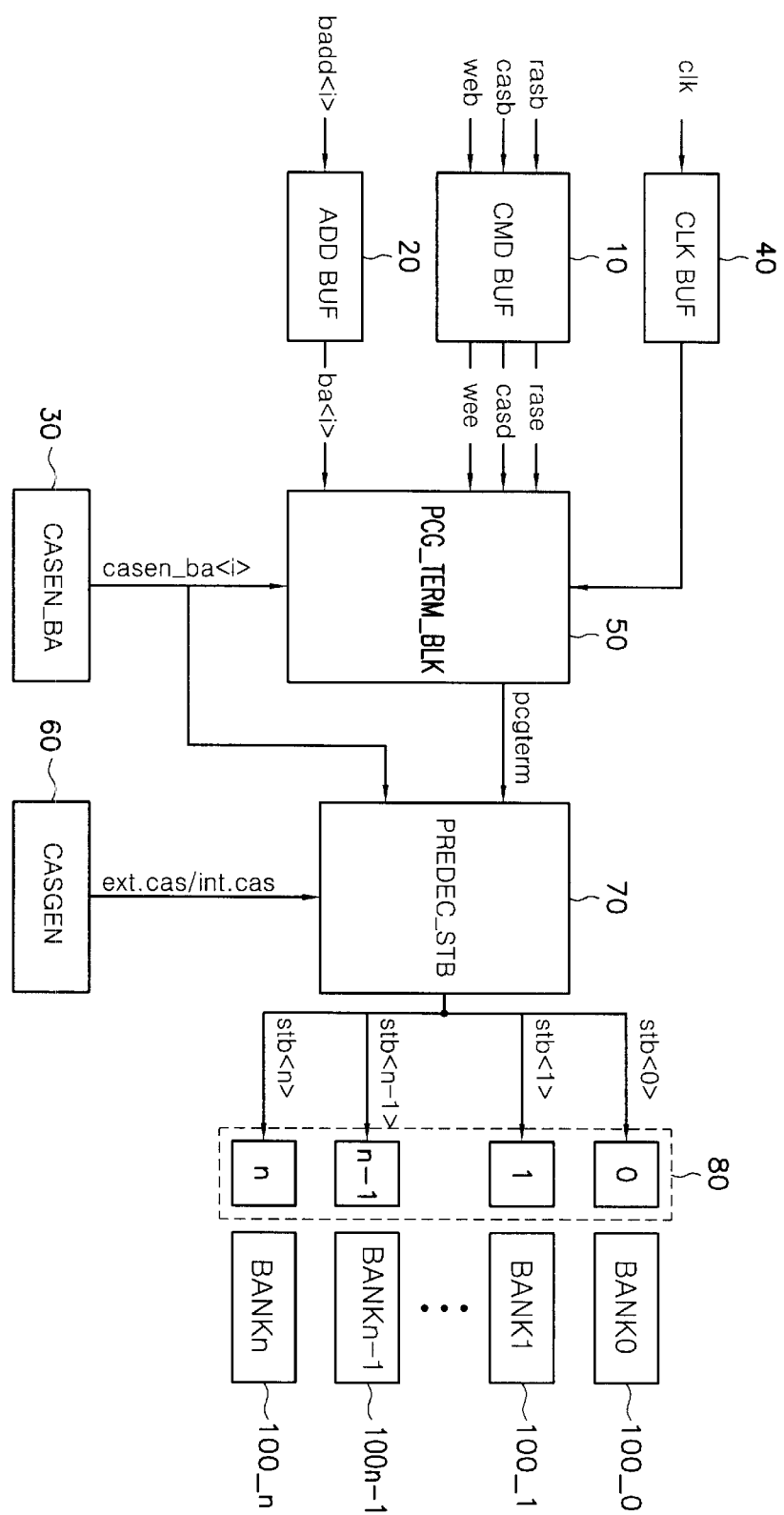
FIG. 2 is a block diagram of semiconductor memory device according to the present invention.

FIG. 2 is a block diagram of semiconductor memory device according to the present invention.

Referring to FIG. 2, the device comprises: a command buffer unit 10 for inputting rasb, casb and web of TTL level and for buffering them to CMOS level; a bank address buffer unit 20 for buffering bank address signal badd<i> of TTL level to CMOS level; a clock buffer unit 40 for buffering clock signal clk of TTL level to CMOS level; a cas enable bank signal generating unit 30 for generating cas enable bank signal casen_ba<i> indicating the bank wherein the CAS is performing; a precharge interrupt signal generating unit 50 for combining output signals rase, casd, and wee of the command buffer unit 10 to detect precharge command and for comparing output signal ba<i> of the bank address buffer unit 20 and the inputted cas enable bank signal casen_ba<i> and if enabled bank corresponds to the bank selected by detected precharge command, for generating precharge interrupt signals and latching the generated precharge interrupt signals to master clock and finally outputting the signal; a predecoder strobe signal generating unit 70 for generating strobe signals operating predecoder to select bank by external cas and internal cas, the operations being controlled by the precharge interrupt signal pcgterm; and a predecoder unit 80 for inputting strobe signals stb<n> outputted from the predecoder strobe signal generating unit 70 and then for selecting corresponding bank n.

The command buffer unit 10, the bank address buffer unit 20 and the clock buffer unit 40 convert external input command from TTL level to CMOS level. And, the output commands rase, casd and wee of command buffer unit 10 and the bank address ba<i> are inputted to the precharge interrupt signal generating unit 50. The output commands rase, casd and wee of command buffer unit 10 are combined into precharge command. And, the bank address ba<i> is compared with the inputted cas enable bank signal casen_ba<i> and if the enabled bank corresponds to the bank selected by detected precharge command, precharge interrupt signal pcgterm is generated.

The precharge interrupt signal pcgterm prevents decoding of address by preventing enabling of predecoder strobe signal stb<n> in predecoder strobe signal generating unit 70. It is possible because predecoder strobe signal stb<n> is enabled by internal CAS command int_cas and external CAS command ext_cas in the predecoder strobe signal generating unit 70 and the signals are enabled in delay time of at least 5 inverters after latched to clock and therefore, there is no problem in controlling predecoder strobe signal stb<n> by precharge interrupt signal pcgterm outputted right after latched to clock.

Figure 3:
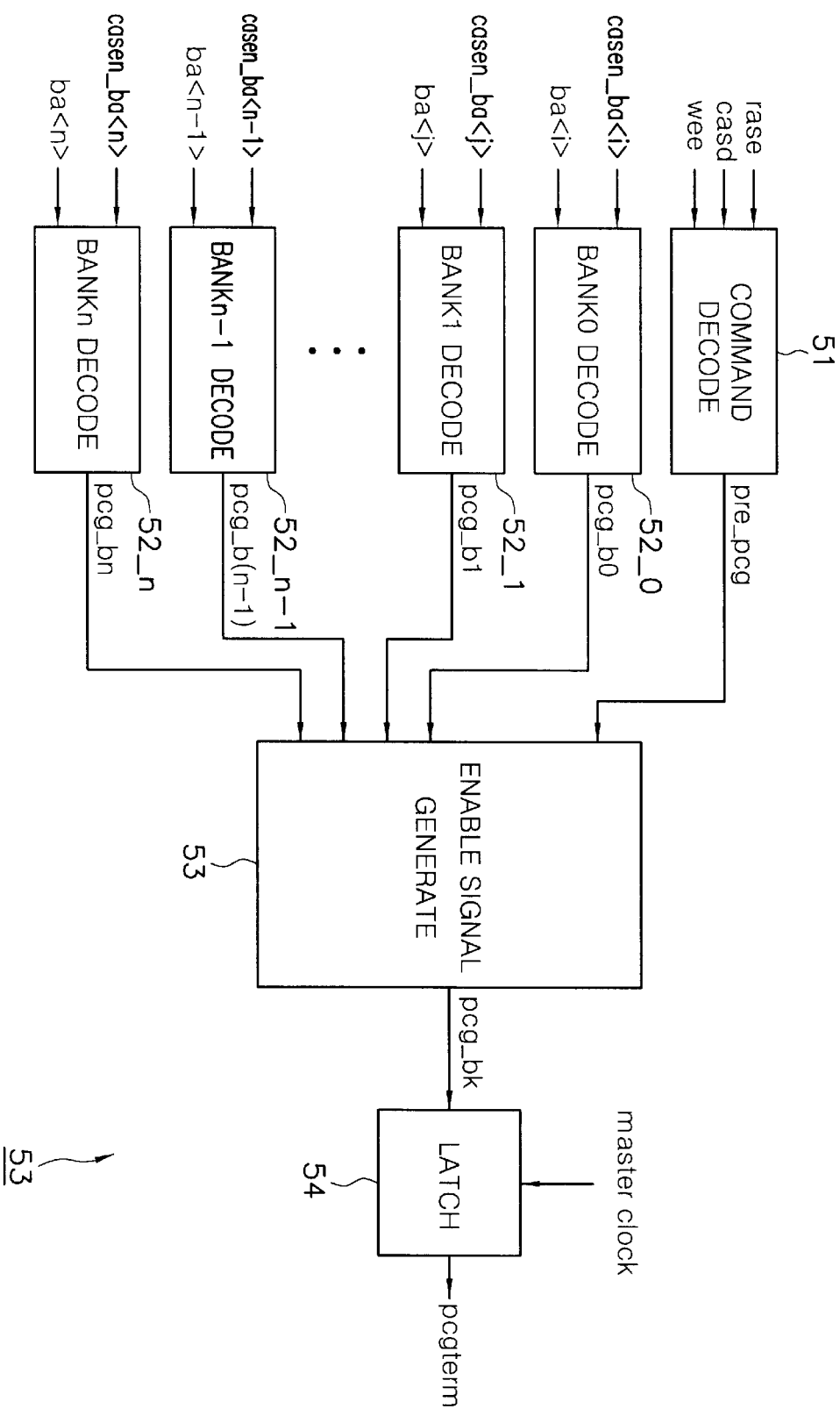
FIG. 3 Is a drawing for showing a precharge interrupt signal generating unit 50 in FIG. 2.

FIG. 3 is a block diagram for showing the precharge interrupt signal generating unit 50 in FIG. 2.

Referring to FIG. 3, the precharge interrupt signal generating unit 50 comprises: a command decoding unit 51 for decoding output signals rase, casd and wee of the command buffer unit 10; n bank decoding unit 52_n for comparing the output signal ba<i> of bank address buffer unit and the cas enable bank signal casen_ba<i> and then for outputting signals indicating whether the enabled band corresponds to the bank selected by detected precharge command; an enable signal generating unit 53 for multiplexing the output signals of n bank decoding unit 52_n according to output signal pre_pcg of the command decoding unit 51 and for generating enable signal pcg_bk; and a latch unit 54 for latching the enable signal pcg_bk to master clock and then for outputting precharge interrupt signal pcgterm.

As shown in FIG. 3, buffered bank address and casen_ba<i:n> indicating bank data of CAS operations are inputted and then decoded.

If output commands rase, casd and wee outputted in the command buffer unit 10 are combined into precharge command, output signal pre_pcg of the command decoding unit 51 is enabled, thereby turning on the enable signal generating unit 53. That is, the output signal pre_pcg of command decoding unit 51 is used as a strobe of the enable signal generating unit 53. And, the inputted bank address ba<n> is compared with the cas enable bank signal casen_ba<i> and if the enabled bank corresponds to the bank selected by pcg command, pcg_bn signal of corresponding bank is enabled and then, inputted in the enable signal generating unit 53.

If the bank performing CAS operations does not correspond to the bank address inputted by pcg command, the enable signal pcg_bk remains disabling. And, if the bank corresponds to the bank address, the enable signal pcg_blk is enabled. Then, the enable signal pcg_bk is latched by internal master clock in the latch unit 54 and precharge interrupt signal pcgterm is outputted.

Here, delay time is controlled to correspond to the time from input of buffered control signal and address to response of the enable signal pcg_bk.

The enable signal pcgterm, enabled and latched to clock, is inputted in the predecoder strobe signal generating unit 70 to interrupt generation of predecoder strobe signal stb according to internal CAS command.

As described above, according to the present invention, recharge interrupt internal command is generated by using delay time for setup/hold time and then the signal is synchronized to internal clock, thereby terminating enable time of interrupt command at the beginning of CAS operation. Therefore, special time of CAS path is interrupted in global area, thereby reducing circuit area and preventing unnecessary circuit operations. As a result, it is effective in saving power consumption.

Although the preferred embodiment of this invention has been disclosed for illustrative purpose, those skilled in the art will appreciate that various modifications, additions and substitutions are possible, without departing from the scope and spirit of the invention.

What is claimed is:

1. A semiconductor memory device comprising:
   a command buffer unit for inputting rasb, casb and web of TTL level and then buffering them to CMOS level;
   a bank address buffer unit for buffering bank address signal of TTL level to CMOS level;
   a cas enable bank signal generating unit for generating cas enable bank signal indicating enabled bank wherein the CAS is being performed;
   a precharge interrupt signal generating unit for combining output signals of the command buffer unit to detect precharge command and for comparing output signal of the bank address buffer unit and the inputted enable bank signal and if enabled bank corresponds to the bank selected by detected precharge command, for generating precharge interrupt signals and latching the generated precharge interrupt signals to master clock and finally outputting the signals; and
   a predecoder strobe signal generating unit for generating strobe signals operating predecoder to select bank by external cas or internal cas, the operations being controlled by the precharge interrupt signal.

2. The semiconductor memory device according to claim 1, wherein the precharge interrupt signal generating unit comprises:
   a command decoding unit for decoding output signals of the command buffer unit;
   a bank decoding unit for comparing the output signal of bank address buffer unit and the cas enable bank signal and then for outputting signals indicating whether the enabled bank corresponds to the bank selected by detected precharge command;
   an enable signal generating unit for generating enable signal by using the output signals of the bank decoding unit according to output signals of the command decoding unit; and
   a latch unit for latching the enable signal to master clock and then for outputting precharge interrupt signal.

* * * * *